United States Patent [19]
Um et al.

[11] Patent Number: 5,175,465
[45] Date of Patent: Dec. 29, 1992

[54] PIEZOELECTRIC AND ELECTROSTRICTIVE ACTUATORS

[75] Inventors: Gregory Um, Torrance; Andrei Szilagyi, Brentwood, both of Calif.

[73] Assignee: Aura Systems, Inc., El Segundo, Calif.

[21] Appl. No.: 779,345

[22] Filed: Oct. 18, 1991

[51] Int. Cl.⁵ .................... H01L 41/09; H02N 2/00
[52] U.S. Cl. ................................ 310/328; 310/366; 359/883
[58] Field of Search ............ 310/328, 330, 331, 333, 310/366; 359/849, 883

[56] References Cited

U.S. PATENT DOCUMENTS

| | | | |
|---|---|---|---|
| 3,507,984 | 4/1970 | Stavis | 178/5.4 |
| 3,510,571 | 5/1970 | Biedermann | 178/5.4 |
| 3,760,096 | 9/1973 | Roth | 178/5.4 ES |
| 3,904,274 | 9/1975 | Feinleib et al. | 310/328 |
| 4,441,791 | 4/1984 | Hornbeck | 350/360 |
| 4,564,782 | 1/1986 | Ogawa | 310/359 |
| 4,566,935 | 1/1986 | Hornbeck | 156/626 |
| 4,571,603 | 2/1986 | Hornbeck et al. | 346/160 |
| 4,615,595 | 10/1986 | Hornbeck | 353/122 |
| 4,638,309 | 1/1987 | Ott | 340/752 |
| 4,680,579 | 7/1987 | Ott | 340/783 |
| 4,705,361 | 11/1987 | Frazier et al. | 350/355 |
| 4,710,732 | 12/1987 | Hornbeck | 332/751 |
| 4,736,132 | 4/1988 | Culp | 310/333 |
| 4,856,863 | 8/1989 | Sampsell et al. | 350/96.16 |
| 4,859,012 | 8/1989 | Cohn | 350/96.24 |
| 4,932,119 | 6/1990 | Ealey et al. | 310/328 |
| 4,956,619 | 9/1990 | Hornbeck | 330/4.3 |
| 4,978,881 | 12/1990 | Wakita et al. | 310/328 |
| 5,001,681 | 3/1991 | Bertoldi et al. | 310/359 |
| 5,028,939 | 7/1991 | Hornbeck et al. | 346/160 |
| 5,089,739 | 2/1992 | Takahashi et al. | 310/328 |

OTHER PUBLICATIONS

Television-A New Schlieren Light Valve For Television Projection, by Van Raalte, Applied Optics, vol. 9, No. 10, Oct. 1970, pp. 2225-2230.

The Mirror-Matrix Tube: A Novel Light Valve For Projection Display, by Thomas et al., IEEE Transactions on Electron Devices, vol. ED-22, No. 9, Sep. 1975, pp. 765-775.

Dynamic Micromechanics on Silicon: Techniques and Devices, by Petersen, IEEE Transactions on Electron Devices, vol. ED-25, No. 10, Oct. 1978, pp. 1241-1250.

TV Projection Display Using An Amorphous-Se-Type Ruticon Light Valve, by Lakatos et al., IEEE Transactions on Electron Devices, vol. ED-24, No. 7, Jul. 1977, pp. 930-934.

Micromechanical Light Modulator Array Fabricated On Silicon, by Petersen, Applied Physics Letters, vol. 31, No. 8, Oct. 15, 1977, pp. 521-523.

*Primary Examiner*—Steven L. Stephan
*Assistant Examiner*—C. LaBalle
*Attorney, Agent, or Firm*—Anthony T. Cascio; Lisa A. Clifford

[57] ABSTRACT

An actuator for tilting the plane of an object is constructed from a stack of piezoelectric or electrostrictive members. First alternate interstices between the members are filled with a first conductive material, except that a first gap remains between the material and one side of the stack. Similarly, second alternate interstices between the members are filled with a second conductive material, except that a second gap remains between the material and an opposite side of the stack. The first gap and the second gap have unequal depth into the stack. The first material in the first interstices is coupled in common and the second material in the second interstices is coupled in common. A voltage applied between the first material and the second material will thereby cause the stack to bend, thereby tilting the plane of the op of the stack.

11 Claims, 1 Drawing Sheet

PIEZOELECTRIC AND ELECTROSTRICTIVE ACTUATORS

RELATED APPLICATION DATA

The present application is related to the following commonly owned, co-pending applications: Ser. No. 07/429,987, Ser. No. 07/448,748, Ser. No. 07/494,579, and Ser. No. 07/504,125, heretofore filed, and to Ser. No. 07/779,346, and Ser. No. 07/779,540, filed concurrently herewith, each of which is incorporated herein by reference.

FIELD OF THE INVENTION

The present invention relates generally to electromechanical actuators and more particularly to such actuators wherein piezoelectric devices convert electrical energy to mechanical actuation.

BACKGROUND OF THE INVENTION

Actuated mirror arrays are useful for one component in the modulation of light intensity wherein the beam reflected from each mirror is modulated by the flux of such beam passing through a slit aperture, as disclosed in Ser. No. 07/429,987 and Ser. No. 07/448,748. As described therein, the flux is controlled by the orientation of the mirror relative to the aperture. A piezoelectric actuator has been disclosed for actuating each mirror in response to an electrical signal applied to each actuator. The electrical signal is commensurate with the degree of modulation desired. The control circuitry for the actuators has been described in Ser. No. 07/504,125 Several examples of piezoelectric actuators and mirror arrays constructed therefrom are disclosed in Ser. No. 07/494,579.

SUMMARY OF THE INVENTION

It is an object of the present invention to provide yet another actuator for such mirror arrays.

According to the present invention, an actuator for tilting the plane of an object is constructed from a stack of piezoelectric or electrostrictive members. First alternate interstices between the members are filled with a first conductive material, except that a first gap remains between the material and one side of the stack. Similarly, second alternate interstices between the members are filled with a second conductive material, except that a second gap remains between the material and an opposite side of the stack. The first gap and the second gap have unequal depth into the stack. The first material in the first interstices is coupled in common and the second material in the second interstices is coupled in common. A voltage applied between the first material and the second material will thereby cause the stack to bend, thereby tilting the plane of the top of the stack.

These and other objects, advantages and features of the present invention will become readily apparent to those skilled in the art from a study of the following Description of an Exemplary Preferred Embodiment when read in conjunction with the attached Drawing and appended Claims.

DESCRIPTION OF AN EXEMPLARY PREFERRED EMBODIMENT

Figure 1:
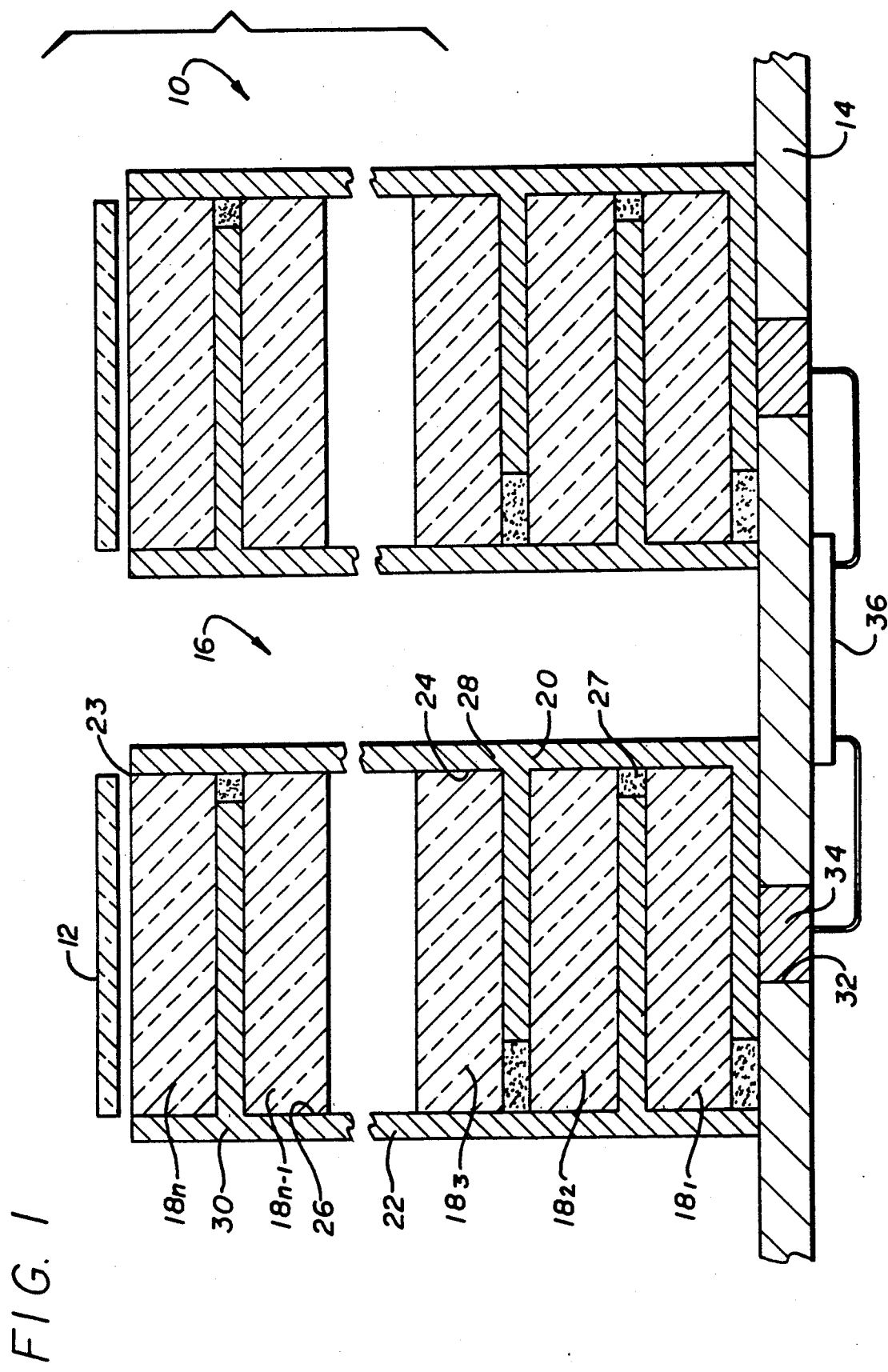
FIG. 1 is a cross sectional view of an actuator constructed according to the principles of the present invention.

Referring now to the Drawing, there is shown a mirror actuator 10 for imparting a tilting motion relative to the plane of a mirror 12. The actuator 10 includes a substrate 14, a stack 16 of piezoelectric members $18_{l-n}$, first conductive material 20 disposed in first alternate interstices between the members $18_{l-n}$ and second conductive material 22 disposed in second alternate interstices between the members $18_{l-n}$. The mirror 12 may be a highly polished top surface 23 of the stack 12 or be mounted to the top surface 23.

The first conductive material 20 is in intimate contact with those piezoelectric members $18_{l-n}$ to which it is adjacent. Similarly, the second conductive material 22 is in intimate contact with those piezoelectric members $18_{l-n}$ to which it is adjacent. Furthermore, the first conductive material 20 extends across the width of the stack 16 and lengthwise from a first side 24 of the stack 16 substantially to but spaced from a second side 26 of the stack 16. Similarly, the second conductive material 22 extends across the width of the stack 16 and lengthwise from the second side 26 of the stack 16 substantially to but spaced from the first side 24 of the stack 16. In each interstice, a gap remains between the first conductive material 20 or the second conductive material 22 and the second side 26 or the first side 24, respectively, of the stack 16.

The conductive material 20, 22 may be an electrically conductive epoxy which serves to apply a voltage to the adjacent face of each member to which it is adjacent and to bind facing members together. Furthermore, a bottom one $18_l$ of the piezoelectric members $18_{l-n}$ may be mounted to the substrate 14 with the first conductive material which facilitates the construction of an array as hereinbelow described. The top of the stack, defined by the top one $18_n$ of the members $18_{l-n}$ may have the mirror 12 mounted to the top surface or, alternatively, the top surface may be highly polished to form the mirror 12. The gaps adjacent the conductive material 20, 22 may be filled with an electrically nonconductive epoxy 27.

The polarization of the piezoelectric members $18_{l-n}$ is selected so that when a voltage is applied between the first conductive material 20 and the second conductive material 22, the piezoelectric member $18_i$ disposed therebetween will either expand or contract as determined by the polarity of the applied voltage. If the gap adjacent the second conductive material is made substantially smaller than the gap adjacent the first conductive material, the stack 16 will bend in response to such voltage, since the members $18_i$, $18_{i+l}$ adjacent the gap with the first conductive material 20 will have a substantially larger portion thereof not effected by an applied voltage. This unaffected portion will not expand or contract thereby causing the tilting of the entire stack 16. The tilting of the stack 16 thereby causes the plane of the top of the stack to tilt.

To apply the voltage, the first side 24 may have a first metalization 28 applied thereto and the second side 26 may have a second metalization 30 applied thereto. The first metalization 28 is in electrical contact with the first conductive material 20 and the second metalization 30 is in electrical contact with the second conductive material 22. The voltage may be readily applied to the metalization 28, 30.

The gap adjacent the second material should be made as small as possible but large enough to avoid electrical conduction between the second material 22 and the first metalization 28. The gap adjacent the first material has a length selected commensurately with the desired degree of bending of the stack 16.

Each of the members $18_{1-n}$ have been described hereinabove as being formed from piezoelectric material. Alternatively, each member $18_{1-n}$ may also be constructed from electrostrictive material. An electrostrictive material will only expand in the presence of an applied voltage.

An array of such actuators 10 may be constructed to be individually addressable. An opening 32 is formed through the substrate 14 underneath each stack 16 of piezoelectric members $18_{1-n}$ in the array of such stacks. A metalization 34 fills the hole and is in electrical contact with the first conductive material 20, which bonds the first member $18_1$ to the substrate 14, and hence is also in contact with the first metalization 28. An addressable driver 36 is mounted to the lower surface of the substrate 14, such as disclosed in Ser. No. 07/504,125, applies a voltage to each metalization 34. The voltage at each pair in the array may be developed in accordance with pixel intensity in a light modulator projection apparatus of the type disclosed in Ser. No. 07/429,987 or Ser. No. 07/448,748. The second metalization 30 may be interconnected in common on the top surface of the substrate.

There has been described hereinabove novel piezoelectric and electrostrictive material actuators which find particular usefulness in a mirror array. Those skilled in the art may now make numerous uses of and departures from the above described embodiments without departing from the inventive concepts disclosed herein. Accordingly, the present invention is to be defined solely by the scope of the following claims.

I claim:

1. An apparatus for tilting the plane of an object comprising:
   a substrate;
   a stack of members formed from a selected one of piezoelectric material and electrostrictive material, a bottom one of said members being mounted to said substrate, said stack having a first side and an opposite second side;
   a first conductive material disposed within first alternate interstices between said members and in intimate contact with members adjacent thereto, said first material extending across a width of said stack and lengthwise from said first side toward said second side but spaced therefrom so that a first gap remains between said first material and said second side; and
   a second conductive material disposed within second alternate interstices between said members and in intimate contact with members adjacent thereto, said second material extending across a width of said stack and lengthwise from said second side toward said first side but spaced therefrom so that a second gap remains between said second material and said first side, said first gap being substantially larger in dimension than said second gap, and said first material in each of said first interstices being electrically connected in common and said second material in each of said second interstices being electrically connected in common so that a voltage applied between said first material and said second material causes said stack to bend thereby tilting the plane of a top of said stack.

2. An apparatus as set forth in claim 1 wherein said first material and said second material is electrically conductive epoxy.

3. An apparatus as set forth in claim 2 wherein said first gap and said second gap are filled with electrically nonconductive epoxy.

4. An apparatus as set forth in claim 2 wherein said bottom member is bonded to said substrate with one of said first material and said second material.

5. An apparatus as set forth in claim 1 wherein said first side has a first metalization layer thereon to contact electrically said first material and said second side has a second metalization layer thereon to contact electrically said second material.

6. An actuated mirror array comprising:
   a substrate having an array of openings therethrough;
   an array of stacks of members formed from a selected one of piezoelectric material and electrostrictive material, a bottom one of said members in each of said stacks being mounted to said substrate proximate a respective one of said openings, each of said stacks having a first side and an opposite second side;
   a first conductive material disposed within first alternate interstices between said members in each of said stacks and in intimate contact with members adjacent thereto, said first material extending across a width of each said stacks and lengthwise from said first side toward said second side but spaced therefrom so that a first gap remains between said first material and said second side; and
   a second conductive material disposed within second alternate interstices between said members in each of said stacks and in intimate contact with members adjacent thereto, said second material extending across a width of each of said stacks and lengthwise from said second side toward said first side but spaced therefrom so that a second gap remains between said second material and said first side, said first gap being substantially larger in dimension than said second gap, and said first material in each of said first interstices for each of said stacks being electrically connected in common and individually addressable through said respective one of said openings and said second material in each of said second interstices being electrically connected in common with all of said stacks so that a voltage applied between said first material and said second material at each of said stacks causes each of said stacks to bend commensurately with the voltage applied thereto thereby tilting the plane of a top of each of said stacks, the top of each of said stacks having mirror finish thereon.

7. An array as set forth in claim 6 wherein said first material and said second material is electrically conductive epoxy.

8. An array as set forth in claim 7 wherein said first gap and said second gap are filled with electrically nonconductive epoxy.

9. An array as set forth in claim 7 wherein said bottom member is bonded to said substrate with said first material.

10. An array as set forth in claim 6 wherein said first side has a first metalization layer thereon to contact electrically said first material of each individual one of said stacks through said respective one of said openings and said second side has a second metalization layer thereon to contact electrically said second material in common with all of said stacks.

11. An array as set forth in claim 10 wherein said bottom member of each of said stacks is bonded to said substrate with said first material over said respective one of said openings, each of said openings being filled with metal to contact said first material for said respective one of said stacks.

* * * * *